(12) United States Patent
Fujimoto et al.

(10) Patent No.: US 10,937,673 B2
(45) Date of Patent: Mar. 2, 2021

(54) SUBSTRATE PROCESSING APPARATUS, SUBSTRATE PROCESSING METHOD AND RECORDING MEDIUM

(71) Applicant: Tokyo Electron Limited, Tokyo (JP)

(72) Inventors: Madoka Fujimoto, Koshi (JP); Toyohisa Tsuruda, Koshi (JP); Masato Hosaka, Koshi (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 77 days.

(21) Appl. No.: 16/220,164

(22) Filed: Dec. 14, 2018

(65) Prior Publication Data

US 2019/0189475 A1 Jun. 20, 2019

(30) Foreign Application Priority Data

Dec. 15, 2017 (JP) .............................. JP2017-241089

(51) Int. Cl.
*G03F 7/20* (2006.01)
*H01L 21/67* (2006.01)
(Continued)

(52) U.S. Cl.
CPC .... *H01L 21/67115* (2013.01); *G03F 7/70008* (2013.01); *G03F 7/70558* (2013.01);
(Continued)

(58) Field of Classification Search
CPC ............. G03F 7/70033; G03F 7/70558; G03F 7/70041; G03F 7/70575; G03F 7/70091; G03F 7/70191; G03F 7/7085; G03F 7/70141; G03F 7/70891; G03F 7/20; G03F 7/0025; G03F 7/70075; G03F 7/70133; G03F 7/70391; G03F 7/70408; G03F 7/70725; G03F 7/7005; G03F 7/70516; G03F 7/7055; G03F 7/70858; G03F 7/70875; G03F 2007/2067; G03F 7/7035; G03F 7/70383; G03F 9/7065; G03F 7/2004; G03F 7/70016; G03F 7/2008; G03F 7/70533; G03F 7/0002; G03F 7/70358; G02B 26/02; G02B 19/0047; G02B 26/06; G02B 6/0068; H01L 21/67115; H01L 21/027; H01L 21/0275; G02F 1/133788;
(Continued)

(56) References Cited

U.S. PATENT DOCUMENTS 5,268,989 A * 12/1993 Moslehi ............ H01L 21/67115
392/418

FOREIGN PATENT DOCUMENTS

JP 2010-080906 A 4/2010
JP 2015-156472 A 8/2015

* cited by examiner

*Primary Examiner* — Mesfin T Asfaw
(74) *Attorney, Agent, or Firm* — Pearne & Gordon LLP

(57) ABSTRACT

A period from a time point when a wafer W is carried into a housing 10 to a time point when the wafer W after being exposed is completely ready to be carried out is set as a single cycle. A time period before a next cycle is begun and after the single cycle is completed is referred to as a standby time period. When an illuminance in dummy light emission is set to be Id; an illuminance in exposure, Is; a time length of the dummy light emission, Td; and a time length of the exposure, Ts, by setting the Id to satisfy an expression of $Id=(Tp/Td)\cdot Iw-(Ts/Td)\cdot Is$, an average illuminance within the single cycle is maintained constant between substrates.

14 Claims, 7 Drawing Sheets

(51) Int. Cl.
*H01L 21/02* (2006.01)
*H05B 45/10* (2020.01)
*H05B 47/16* (2020.01)

(52) U.S. Cl.
CPC ...... *G03F 7/70575* (2013.01); *G03F 7/70891* (2013.01); *H01L 21/02348* (2013.01); *H01L 21/67248* (2013.01); *H01L 21/67253* (2013.01); *H05B 45/10* (2020.01); *H05B 47/16* (2020.01)

(58) Field of Classification Search
CPC ........ A61N 5/062; Y02B 20/40; Y02E 10/50; B60Q 1/143
See application file for complete search history.

SUBSTRATE PROCESSING APPARATUS, SUBSTRATE PROCESSING METHOD AND RECORDING MEDIUM

CROSS-REFERENCE TO RELATED APPLICATION

This application claims the benefit of Japanese Patent Application No. 2017-241089 filed on Dec. 15, 2017, the entire disclosure of which is incorporated herein by reference.

TECHNICAL FIELD

The various aspects and embodiments described herein pertain generally to a technique of irradiating light to a substrate to perform a processing on the substrate.

BACKGROUND

In the field of manufacture of a semiconductor device, extreme ultraviolet (EUV) exposure, for example, is known as a method capable of dealing with a high resolution of a circuit pattern. The EUV exposure, however, has drawbacks in that if light intensity of an exposure light source is increased, an apparatus is scaled-up, resulting in a cost increase.

In this regard, Patent Document 1 discloses an exposure apparatus configured to perform pattern exposure on a semiconductor wafer (hereinafter, simply referred to as "wafer") coated with a photosensitizing chemical amplification resist by using a pattern mask and then expose the whole pattern-exposed region to light at one time to improve uniformity of a line width of a pattern (circuit pattern) on the wafer within an entire surface thereof. This whole type exposure apparatus forms on the wafer a band-shaped irradiation region slightly longer than a diameter of the wafer by using a LED (Light Emitting Diode) as a light source, and exposes the entire surface of the wafer to light by moving the wafer in a direction perpendicular to a direction in which the irradiation region is extended.

This whole type exposure apparatus is provided in a coating and developing apparatus including a coating module configured to coat a resist on the wafer, a developing module configured to perform a developing processing on the wafer after being exposed with the pattern mask, and so forth. A temperature of the LED is determined based on heat generation of the LED itself and ambient temperature. After the LED is turned on or illuminance thereof is changed, it takes some time for the LED temperature to be stabilized.

Thus, in the whole type exposure apparatus, if there is a long pause after a processing upon a previous lot of wafers is finished and before a next lot of wafers is transferred therein, exposure of the wafers belonging to the next lot is performed in a state that the LED temperature is not stabilized. Further, if the illuminance of the LED in the exposure of the previous lot of wafers and the illuminance of the LED in the exposure of the next lot of wafers are different, the exposure of the next lot of wafers is performed in a state that the LED temperature is not stabilized, even if the exposure of the next lot of wafers is performed immediately after the processing upon the previous lot of wafers is finished.

The illuminance (illuminance of a preset surface) of the LED varies depending on a temperature thereof even if a driving current is maintained constant. In case that the line width of the circuit pattern is fine, the degree of contribution of the illuminance of the irradiation region to a variation of the line width of the circuit pattern is increased. As a way to regulate the illuminance of the irradiation region constant, there is known a method of detecting an emission state of the LED by a luminance sensor and maintaining the illuminance constant by feedback of this detection signal (see Patent Document 2). This method, however, involves a complicated structure.

Furthermore, if the LED temperature varies, spectral characteristics are also varied. Depending on the kind of the resist, the line width of the pattern after the developing processing may fall out of an expected dimension, and this may affect a yield if the line width of the pattern is further miniaturized. The aforementioned method, however, is a not a technique capable of solving such a problem.

As stated above, in the exposure apparatus using the LED, since the emission state of the LED varies depending on the temperature variation thereof, stable exposure may not be accomplished.

Patent Document 1: Japanese Patent Laid-open Publication No. 2015-156472
Patent Document 2: Japanese Patent Laid-open Publication No. 2010-080906

SUMMARY

In view of the foregoing, exemplary embodiments provide a technique capable of stabilizing a light emission state of a light source unit between substrates and capable of performing a processing on the substrates stably in a substrate processing apparatus configured to irradiate light to the substrates to process the substrates by using the light source unit configured to change the light emission state thereof based on a temperature variation.

In one exemplary embodiment, a substrate processing apparatus configured to irradiate, to perform a processing on a substrate, light to the substrate in a single cycle ranging from a time point when the substrate is carried into a housing from an outside to a time point when the substrate is ready to be carried out to the outside or to a time point when the substrate is carried out to the outside includes:

a placing unit configured to place the substrate thereon and provided within the housing;

a light source unit configured to irradiate the light to the substrate placed on the placing unit, an emission state of the light source unit being varied depending on a temperature thereof;

and a control unit configured to output a control signal such that, when a preset time length of the single cycle is referred to as a cycle time and a time period during which the light is irradiated to the substrate to perform the processing on the substrate is referred to as a processing time period, an average illuminance of an irradiation region within the single cycle is maintained constant between substrates by allowing the light source unit to perform dummy light emission in a time period other than the processing time period within the single cycle and adjusting an illuminance of the irradiation region in the dummy light emission based on an illuminance of the irradiation region in the processing time period.

In another exemplary embodiment, a substrate processing method of irradiating, to perform a processing on a substrate, light to the substrate from a light source unit whose emission state is varied depending on a temperature thereof in a single cycle ranging from a time point when the substrate is carried into a housing from an outside to a time point when the substrate is ready to be carried out to the outside or to a time point when the substrate is carried out to the outside includes adjusting, when a preset time length of the single cycle is referred to as a cycle time and a time period during which the light is irradiated to the substrate to perform the processing on the substrate is referred to as a processing time period, an illuminance of an irradiation region in dummy light emission based on an illuminance of the irradiation region in the processing time period such that an average illuminance of the irradiation region within the single cycle is maintained constant between substrates by allowing the light source unit to perform the dummy light emission in a time period other than the processing time period within the single cycle.

In yet another exemplary embodiment, there is provided a computer-readable recording medium having stored thereon computer-executable instructions that, in response to execution, cause a substrate processing apparatus configured to irradiate, to perform a processing on a substrate, light to the substrate in a single cycle ranging from a time point when the substrate is carried into a housing from an outside to a time point when the substrate is ready to be carried out to the outside or to a time point when the substrate is carried out to the outside to perform the substrate processing method.

According to the exemplary embodiment as stated above, the light source unit performs the dummy light emission in the time period other than the processing time period within the single cycle ranging from the time point when the substrate is carried into the housing from the outside to the time point when the substrate is ready to be carried out to the outside or to the time point when the substrate is carried out to the outside. Further, by adjusting the illuminance of the irradiation region (preset surface, for example, irradiation region on the substrate) in the dummy light emission based on the illuminance of the irradiation region in the processing time period, the average illuminance of the irradiation region within the single cycle is maintained constant between substrates, that is, during each cycle. Accordingly, even in case that the illuminance of the irradiation region in the processing time period is changed, the average heat generation amount of the light source unit within the single cycle is uniformed between the cycles. Thus, the light emission state of the light source unit in the processing time period is uniformed, so that the processing can be performed on the substrate stably.

The foregoing summary is illustrative only and is not intended to be any way limiting. In addition to the illustrative aspects, embodiments, and features described above, further aspects, embodiments, and features will become apparent by reference to the drawings and the following detailed description.

BRIEF DESCRIPTION OF THE DRAWINGS

In the detailed description that follows, embodiments are described as illustrations only since various changes and modifications will become apparent to those skilled in the art from the following detailed description. The use of the same reference numbers in different figures indicates similar or identical items.

FIG. 5 is a graph showing a relationship between an illuminance of the LED when the LED performs dummy light emission and an illuminance of the LED when a substrate stands by;

DETAILED DESCRIPTION

Figure 1:
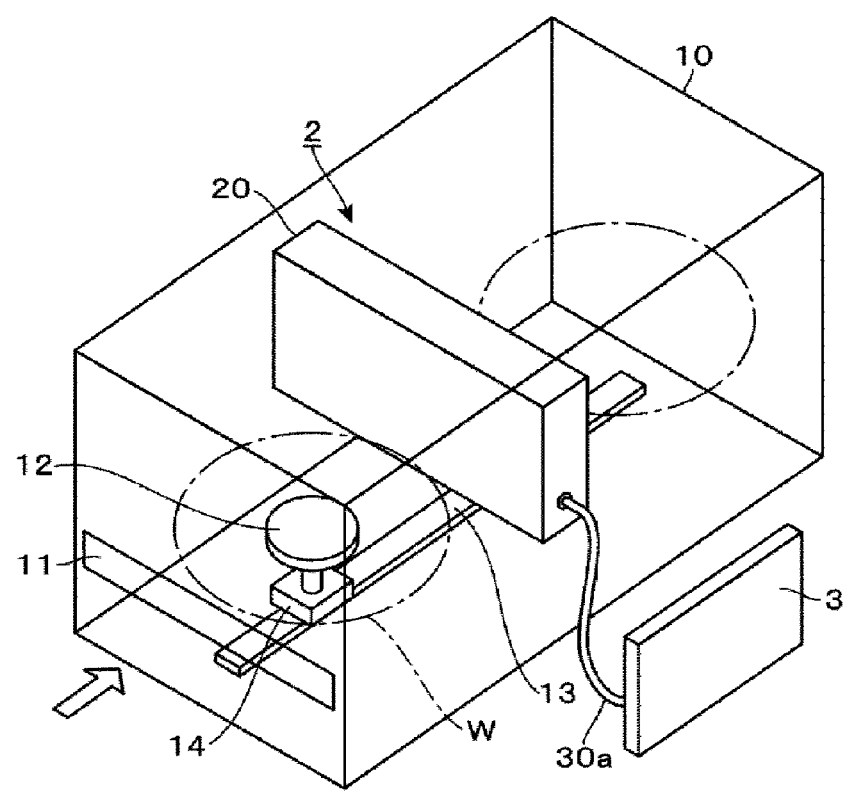
FIG. 1 is a schematic perspective view of a substrate processing apparatus according to an exemplary embodiment.

In the following detailed description, reference is made to the accompanying drawings, which form a part of the description. In the drawings, similar symbols typically identify similar components, unless context dictates otherwise. Furthermore, unless otherwise noted, the description of each successive drawing may reference features from one or more of the previous drawings to provide clearer context and a more substantive explanation of the current exemplary embodiment. Still, the exemplary embodiments described in the detailed description, drawings, and claims are not meant to be limiting. Other embodiments may be utilized, and other changes may be made, without departing from the spirit or scope of the subject matter presented herein. It will be readily understood that the aspects of the present disclosure, as generally described herein and illustrated in the drawings, may be arranged, substituted, combined, separated, and designed in a wide variety of different configurations, all of which are explicitly contemplated herein.

FIG. 1 is an exterior view of a substrate processing apparatus according to an exemplary embodiment. The substrate processing apparatus is equipped with a housing 10 having a carry-in/out opening 11 formed at a front side thereof. In FIG. 1, the housing 10 is illustrated to be transparent to show the inside of the housing 10. A placing table 12 equipped with a vacuum chuck configured to place thereon a wafer W which is a substrate as an exposure target is provided at a bottom surface of the housing 10. The placing table 12 is connected via a rotation shaft to a driving unit 14 configured to be movable along a guide rail 13, which is extended from a first position as a transfer position (shown in FIG. 1) for the wafer W at a carry-in/out opening 11 side to a second position at an inner side of the housing 10, and configured to rotate the wafer W placed on the placing table 12 around a vertical axis. Further, the driving unit 14 is composed of a combination of a motor configured to rotate the placing table 12 and a moving mechanism configured to hold the motor and be moved along the guide rail 13.

Provided at the first position within the housing 10 is a non-illustrated commonly known position adjusting mechanism (a mechanism equipped with a light emitting unit and a light receiving unit vertically arranged to face each other with an edge portion of the wafer W therebetween). A direction of a notch as a position adjustment portion formed at an edge of the wafer W is detected by this position adjusting mechanism, and the wafer W to be subjected to an exposure processing is controlled to be constantly oriented toward a preset direction through the rotation of the placing table 12 by the driving unit 14.

Figure 2:
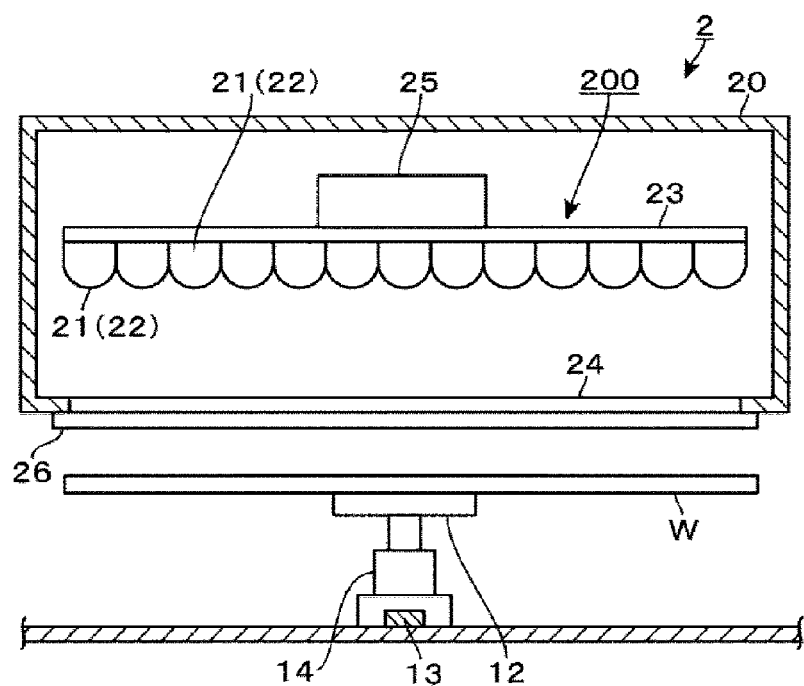
FIG. 2 is a transversal front view of the substrate processing apparatus according to the exemplary embodiment.

Further, a light irradiating unit 2 configured to irradiate an ultraviolet ray to the wafer W is provided above a space between the first position of the wafer W and the aforementioned second position in a region where the wafer W is moved. If a moving direction of the wafer W is defined as a forward-backward direction, the light irradiating unit 2 is equipped with a rectangular case 20 having a width larger than a width of the moving region of the wafer W in a left-right direction, and a LED light source group 200 as a light source unit is provided within the case 20, as illustrated in FIG. 1 and FIG. 2. The LED light source group 200 includes a plurality of LED blocks 22 arranged in the left-right direction, and each LED block 22 includes a multiple number of LEDs 21 arranged in the forward-backward direction. Further, in the arrangement of the LEDs in the drawings, an arbitrary number of LEDs is illustrated for the convenience of illustration and easy understanding of the structure.

The LED light source group 200 is fixed to a common LED board 23 provided within the case 20 and is configured to irradiate an ultraviolet ray downwards. A slit 24 as an irradiation opening, which is extended in the left-right direction and has a length longer than the width of the moving region of the wafer W in the left-right direction, is formed at a bottom surface of the case 20, and the ultraviolet ray generated from the LED light source group 200 is irradiated to below the light irradiating unit 2 through the slit 24. A control circuit unit 25 constituting a LED control unit is provided at a top surface side of the LED board 23, and the control circuit unit 25 is configured to control a power feed to each of the LED blocks 22. The control circuit unit 25 is equipped with a CPU, a working memory, and so forth. A reference numeral 26 denotes a metal shutter configured to open or close the slit 24.

Figure 3:
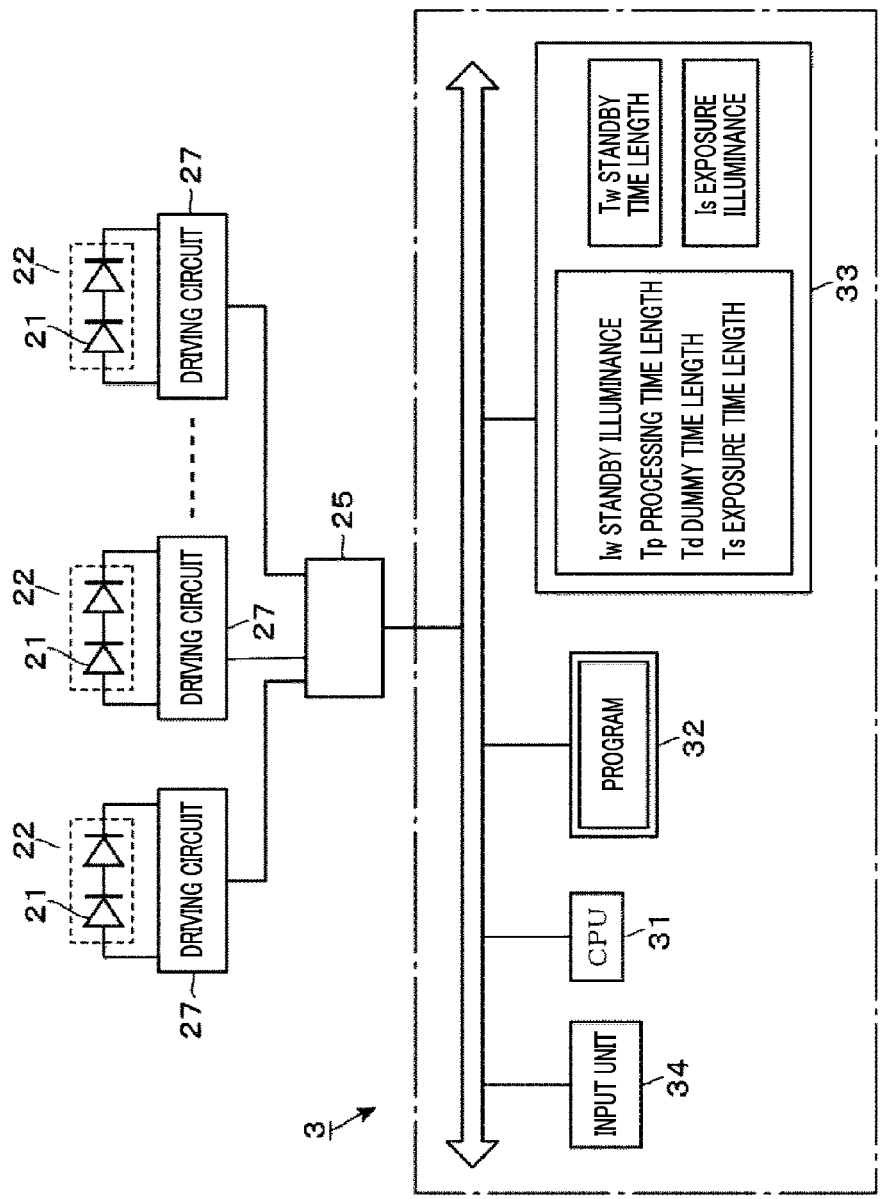
FIG. 3 is a block circuit diagram for controlling an illuminance of a LED in the substrate processing apparatus according to the exemplary embodiment.

Now, a control system of the substrate processing apparatus will be explained with reference to FIG. 3. In FIG. 3, a reference numeral 27 denotes a driving circuit configured to drive the LEDs 21, and the multiple number (in FIG. 3, only two are shown for the simplicity of illustration) of LEDs 21 are connected in series to the corresponding one of the driving circuits 27. That is, each driving circuit 27 is provided for the corresponding one of the LED blocks 22. The driving circuit 27 includes, by way of example, a transistor. The transistor is turned on by a base voltage supplied from a transistor control circuit within the control circuit unit 25, so that the LEDs 21 are turned on. Further, though the driving circuits 27 are illustrated to be located at an outside of the control circuit unit 25 in FIG. 3, the driving circuits 27 may be provided within the control circuit unit 25, for example. As a specific example, a driving signal (base voltage) is supplied to the transistor from the control circuit unit 25 at a preset duty ratio, and, in this case, an illuminance of an irradiation region of the LED light source group 200 is determined based on the duty ratio. Here, the irradiation region refers to a surface corresponding to a surface of the wafer W to which the ultraviolet ray is irradiated by the LED light source group 200.

Referring back to FIG. 1, a controller 3 is connected via a signal cable 30a to an outside of the housing 10 which is a casing of the substrate processing apparatus. The controller 3 is equipped with a CPU 31, a program storage unit 32 configured to store a program therein, a memory 33 as a storage unit, and an input unit 34 including a control screen.

Prior to explaining the controller 3, a relationship between sequences performed in the substrate processing apparatus and a control over a light emission amount of the LED 21, that is, a control over an illuminance of the irradiation region will be first discussed.

After the wafer W is carried into the substrate processing apparatus by an external wafer transfer device, exposure is performed on the wafer W, and the wafer W after being exposed is carried out from the substrate processing apparatus. The present exemplary embodiment aims at uniforming a temperature of the LED 21 in the exposure processing between the wafers W by regulating constant an average value of the illuminance of the LED light source group 200 while these series of sequences are being performed. For the purpose, in the present exemplary embodiment, as a pre-stage of the exposure, a preset time period during which dummy light emission is performed is set to the LED light source group 200. If this time period is referred to as a dummy light emission (irradiation) time period, a sum of the dummy light emission time period, an exposure time period, and a time period taken for the wafer W to get completely ready to be carried out after being exposed is maintained constant.

That is to say, a period from a time point when the wafer W is carried into the housing 10 from the external wafer transfer device to a time point when the wafer W after being exposed is completely ready to be carried out is set as a single cycle, and this single cycle is set to be uniform between the wafers W of different kinds. The time point when the wafer W is carried into the housing 10 refers to, for example, a time point when the wafer W is placed on the placing table 12 through an elevation movement of the external wafer transfer device. Further, the time point when the wafer W is completely ready to be carried out refers to a time point when the vacuum chuck is turned off (attraction is stopped) after the placing table 12 is moved from the second position to the first position.

The substrate processing apparatus according to the present exemplary embodiment is provided within, for example, a coating and developing apparatus including a module configured to coat a resist on the wafer, a module configured to develop the wafer after the wafer is subjected to pattern exposure using a pattern mask by an exposure device, and so forth. The coating and developing apparatus is configured to move a wafer transfer device having two transfer arms between the modules in a preset sequence, take out a wafer W after being processed from each module by one of the two transfer arms, and deliver a wafer W before being processed into each module by the other of the two transfer arms. The wafer transfer device is operated according to a throughput set in the coating and developing apparatus.

Thus, if the single cycle is completed in the substrate processing apparatus, the wafer W may sometimes be immediately carried out or, depending on the setting of the throughput, the wafer W may stand by. In case that the wafer W stands by, there exists a standby time period until a next cycle is begun after the single cycle is ended. Further, the standby time period may also exist when there is an interval between a time point when a single lot is carried into the coating and developing apparatus and a time point when a next lot is carried into the coating and developing apparatus, that is, when the lots are not continuously carried in, or when the transfer of the wafer within the coating and developing apparatus is stopped due to a trouble of the apparatus. In this case, there is generated a standby time period ranging from a time point when the single cycle is completed as the wafer W after being exposed is delivered to the external wafer transfer device to a time point when the next cycle is begun, that is, a next wafer W is placed on the placing table 12.

Further, a time length of the aforementioned single cycle is longer than a time length of a single cycle in the other modules within the coating and developing apparatus. Therefore, in case that the wafer W is carried out immediately after the corresponding wafer W is ready to be carried out in the substrate processing apparatus, a time point when the wafer W is delivered to the external wafer transfer device may be regarded as the time point when the single cycle is completed.

Figure 4:
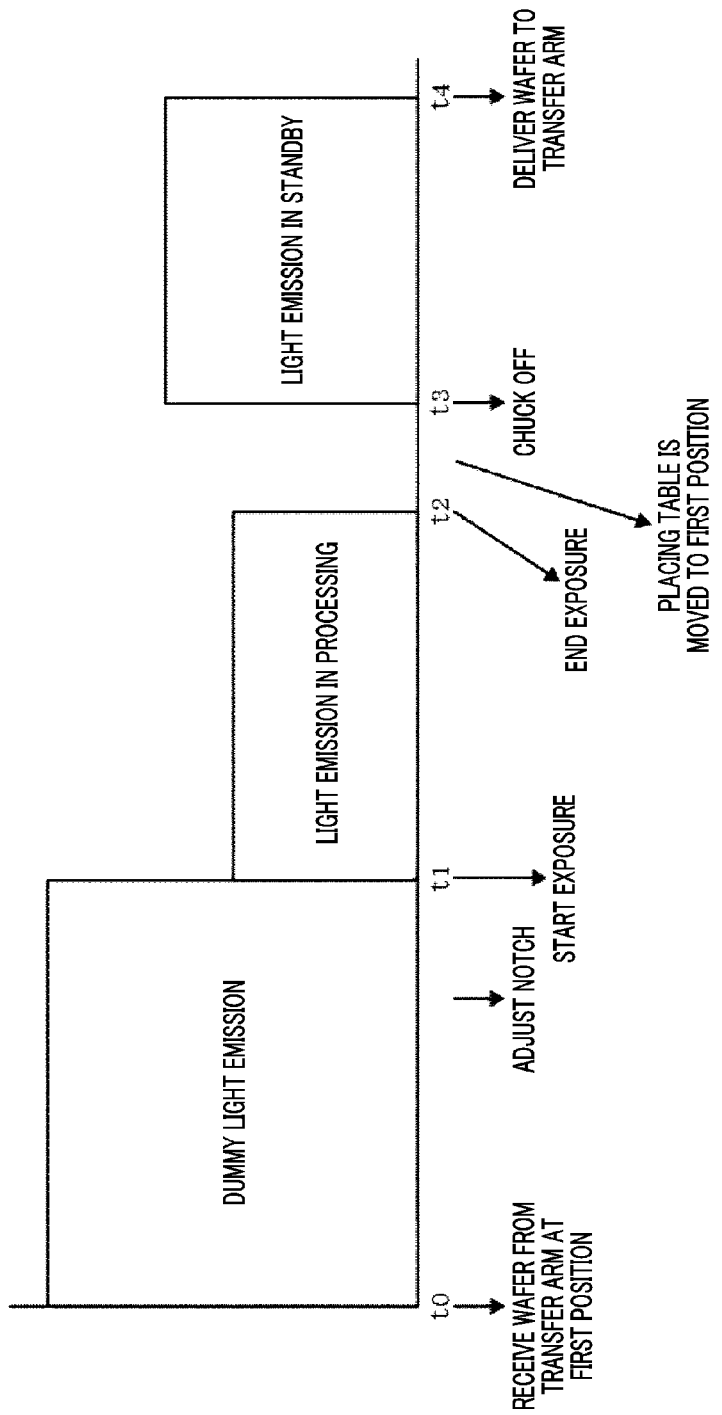
FIG. 4 is an explanatory diagram for describing an operation of the substrate processing apparatus according to the exemplary embodiment.

Provided at an upper side of FIG. 4 is an image showing a relationship between the dummy light emission time period, the exposure time period and the standby time period and an illuminance of the irradiation region (hereinafter, sometimes simply referred to as "illuminance") in each time period. A vertical axis of FIG. 4 represents an illuminance. If the illuminance of the LED is changed (including a case where the LED is turned on from off), the temperature of the LED gradually changes. For this reason, according to the present exemplary embodiment, there is provided the dummy light emission time period to allow the temperature in the exposure to be maintained constant even in case that the illuminance in the exposure is changed between the lots of the wafers W (a light emission amount of the LED light source group 200 is changed) or even in case that a time length of the standby time period is changed.

The dummy light emission is performed to allow an average illuminance to be maintained constant while the aforementioned single cycle is being performed. Further, in case that there exists the standby time period, the average illuminance in the single cycle and the average illuminance in the standby time period are set to be equal. Thus, in the present exemplary embodiment, a time (time length) of the exposure time period, a time (time length) of the dummy light emission time period are previously set, and the illuminance in the dummy light emission is set based on the illuminance in the exposure depending on the lots of the wafers W, which is determined according to a process recipe.

If there exists no standby time period, an illuminance Id in the dummy light emission is calculated from the following expression (1), when a set value of the average illuminance in the single cycle is set to be Ia.

$$Ia = (Td \cdot Id + Ts \cdot Is)/Tp \quad (1)$$

Here, Td denotes the time length of the dummy light emission time period; Id, the illuminance in the dummy light emission; Ts, the time length of the exposure time; Is, the illuminance in the exposure; and Tp, the time length of the single cycle.

When there exists the standby time period, the illuminance Id in the dummy light emission is determined based on the following expression (2) in view of the fact that the set value Ia of the average illuminance in the expression (1) corresponds to a set value Iw of the average illuminance in the standby time period.

$$Iw = (Td \cdot Id + Ts \cdot Is)/Tp \quad (2)$$

Thus, by adjusting the illuminance in the dummy light emission based on the illuminance in the exposure, the average illuminance within the single cycle is maintained constant between the wafers W or between the lots.

Here, the set value Iw of the average illuminance in the standby time period will be discussed. If the aforementioned expression (2) is transformed, the following expression (3) is established.

$$Id = (Tp/Td) \cdot Iw - (Ts/Td) \cdot Is \quad (3)$$

Figure 5:
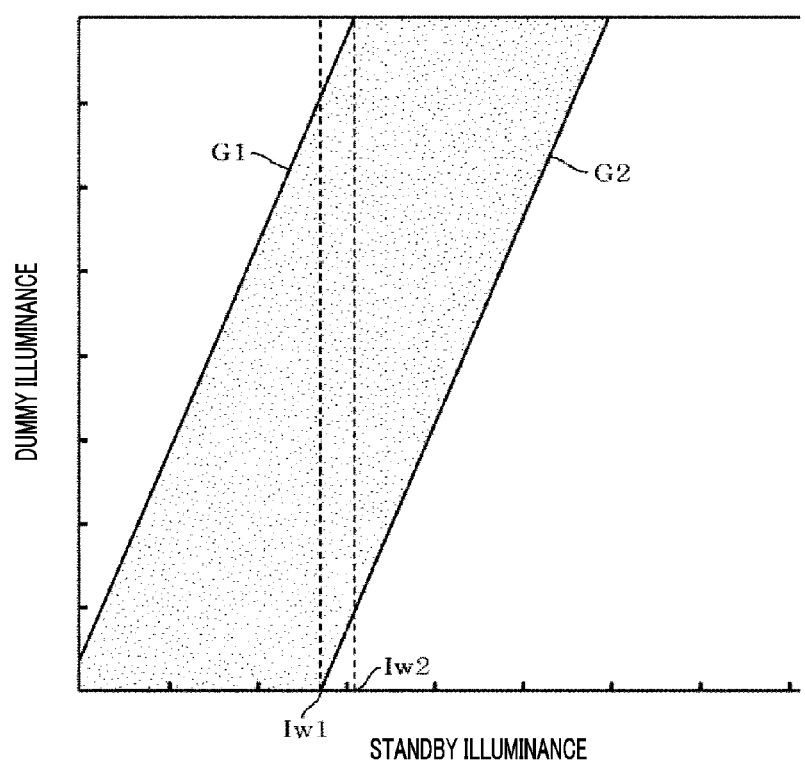

FIG. 5 is a graph showing a relationship between Id and Iw based on the expression (3). In this example, Id is expressed as a linear function of Iw as Tp and Td are preset values. G1 is a graph showing a case in which the illuminance in the exposure is lowest. Since there is no such case that the illuminance Is is zero when the exposure is performed, a minimum value of the illuminance Is in the exposure is expressed as an assumed value larger than zero. G2 is a graph showing a case in which the highest illuminance Is in the exposure is highest. Accordingly, a combination of Id and Iw is within a region (indicated by dots) between G1 and G2.

An illuminance corresponding to an upper limit of the light emission amount of the LED light source group 200 is set as an upper limit for the illuminance Id in the dummy light emission and the illuminance Iw in the standby time period. The illuminance of the irradiation region is determined based on a power supplied to the LED light source group 200, and, in the preset exemplary embodiment, this power is determined based on the on/off duty ratio of the transistor of the LED driving circuit 27. Accordingly, the illuminance Id in the dummy light emission and the illuminance Iw in the standby time period correspond to a digital value of a digital signal for setting the above duty ratio by the controller 3.

As stated above, the time length Tp of the single cycle, the time length Td of the dummy light emission time period and the time length Ts of the exposure are previously set. Thus, the standby illuminance Iw, from which the illuminance Id in the dummy light emission can be set based on the expression (3), falls within a range from Iw1 to Iw2 indicated by dotted lines in FIG. 5, if it is assumed that the illuminance Is in the exposure in the substrate processing apparatus may range from the aforementioned minimum value (minimum value set by the maker) to the value corresponding to the upper limit of the light emission amount of the LED light source group 200. When the illuminance Is in the exposure is of the minimum value, the illuminance Id in the dummy light emission is of a value between Iw1 and Iw2 on the graph G1. Further, when the illuminance Is in the exposure is of the maximum value, the illuminance Id in the dummy light emission is of a value between Iw1 and Iw2 on the graph G2.

If the illuminance in the standby time period is set to a value between Iw1 and Iw2, the illuminance Id in the dummy light emission can be set regardless of the illuminance Is in the exposure.

The LED light source group 200 is extend in the left-right direction, and, thus, a region on the wafer W to which the light is irradiated by the LED light source group 200 is a long strip shape in a widthwise direction. Since the exposure needs to be performed uniformly within the surface of the wafer W, uniformity of the illuminance of the irradiation region is high. Thus, regarding the illuminance in the present exemplary embodiment, it may be regarded that the illuminance of the irradiation region is uniform. That is, each LED block 22 is driven to be turned on and off at the same duty ratio, and the illuminance is defined by setting this duty ratio.

Referring back to FIG. 3, the controller 3 has a function of setting the illuminance in the dummy light emission based on the above-specified expression (3). The standby illuminance Iw, the time length Tp of the single cycle, the time length Td of the dummy light emission time period and the time length Ts of the exposure are stored in the memory 33 as individually preset values. Further, the exposure illuminance Is and the standby time Tw specified by the process recipe sent from, for example, a top computer for each lot of the wafers are written in the memory 33. The standby illuminance Iw is the preset value as stated above. Further, the standby time Tw is designated by, for example, the top computer based on a timing of the carry-in of the lot of the wafers into the coating and developing apparatus, and the designated standby time Tw is written in the memory 33. In case that there is generated the standby time caused by the trouble of the coating and developing apparatus or the like, it is informed from the top computer that there is generated the standby time after the completion of the single cycle, and, in this case, each LED block 22 is controlled to have the preset standby illuminance Iw until the next cycle is performed.

Stored in the program storage unit 32 are the series of sequences from the carry-in of the wafers W into the housing 10 to the carry-out of the wafers W to the outside of the housing 10 and a program regarding a light emission control over the LED light source group 200. Further, the program includes a processing step group for operating the expression (3) as well as a processing step group regarding a timing for performing the dummy light emission.

The aforementioned program is stored in a recording medium such as, by way of non-limiting example, a flexible disk, a compact disk, a hard disk, a MO (magneto-optical disk), or a memory card and is installed from the recording medium to the program storage unit 32.

Now, an operation of the above-described exemplary embodiment will be explained. At a time t0 shown in FIG. 4, a wafer W is transferred onto the placing table 12 located at the first position as the transfer position within the housing 10 through the carry-in/out opening 11 shown in FIG. 1 by the external wafer transfer device. Then, the wafer W is attracted by the vacuum chuck provided in the placing table 12, so that the wafer W is firmly held on the placing table 12. Thereafter, the placing table 12 is rotated by, for example, 360 degrees at the first position, and a position of the edge of the wafer W in a diametrical direction is detected by a non-illustrated light emission/reception sensor. Then, a position of the notch is calculated based on the detection result, and the placing table 12 is rotated such that the notch is oriented toward a preset direction. In this way, the position adjustment on the wafer W is performed. Through this position adjustment, an arrangement direction of circuit chips on the wafer W and a lengthwise direction of the irradiation region are made to be coincident, for example.

The placing table 12 is stopped at the first position until the time length Td of the dummy light emission elapses after the position adjustment on the wafer W is performed, and, after the lapse of the time length Td, the placing table 12 is moved from the first position toward the second position. Accordingly, the wafer W is allowed to pass through the strip-shaped irradiation region under the light irradiating unit 2 (LED light source group 200). That is, the strip-shaped irradiation region is allowed to scan the surface of the wafer W relatively. Within the moving region of the wafer W in the strip-shaped irradiation region, the illuminance distribution pattern is adjusted to a target illuminance distribution pattern, for example, an illuminance distribution pattern which is uniform with high accuracy in the lengthwise direction. Accordingly, an exposure amount of the entire wafer W is uniformed.

In FIG. 4, a time t1 of beginning the exposure and a time t2 of completing the exposure are respectively shown. Upon the completion of the exposure, the placing table 12 is moved from the second position toward the first position. At a time t3 when the placing table 12 reaches the first position, the vacuum chuck of the placing table 12 is turned off so that the single cycle is ended. By way of example, if the time length of the single cycle in the substrate processing apparatus is shorter than a transfer interval for the wafer W in the coating and developing apparatus, there exists the standby time period, so that the wafer W after being exposed needs to stand by on the placing table 12 until a next wafer W is carried in. In a period from the time t2 to the time t3, the illuminance is set to be zero.

At a time t4, the wafer W on the placing table 12 is taken out by the external wafer transfer device, and, subsequently, the next wafer W is transferred onto the placing table 12 and the same operations as described above are repeated. The replacement between the wafer W after being exposed and the next wafer W to be processed is instantly performed as the two arms of the wafer transfer device advance and retreat in sequence. Thus, the time t4 when the standby time period ends and a time (corresponding to a time t0 of the previous cycle) when a next cycle starts are substantially same, and the aforementioned operations from the times t0 to t4 are repeated.

In the dummy light emission time period from the time t0 to the time t1, the light emission amount of the LED light source group 200 is adjusted through the program stored in the program storage unit 32 such that the illuminance calculated by the expression (3) is obtained as stated above. Further, in the exposure time period from the time t1 to the time t2 and the standby time period from the time t3 to the time t4, the light emission amount of the LED light source group 200 is adjusted according to the program stored in the program storage unit 32 such that the illuminance reaches the value written in the memory 33.

As examples of the individual time periods, the time of the dummy light emission is 16 sec; the time of the exposure, 15 sec; and the time of the single cycle, 33 sec; and the time for the standby, 5 sec.

According to the above-described exemplary embodiment, even in case that the illuminance on the wafer W in the exposure is different between the lots (kinds) of the wafers, the average illuminance by the LED light source group 200 within the single cycle is uniformed by performing the dummy light emission of the LED light source group 200. Further, in the standby time period after the completion of the single cycle, the LED light source group 200 is controlled to perform the light emission such that the average illuminance in the standby time period is equal to the average illuminance in the single cycle. Therefore, even if the heat generation amounts of the LED light source group 200 in the exposure are different between the lots of the wafers W, the average heat generation amount of the LED light source group 200 in a time period until the next wafer W is carried in after the wafer W is carried into the housing 10 is uniformed between the cycles. Therefore, the temperature of the LED light source group 200 is maintained constant, so that the light emission state of the LED light source group 200 is stabilized.

Moreover, according to the above-described exemplary embodiment, as compared to the prior art method of detecting the light emission state of the LED by the luminance sensor and uniforming the illuminance by feedback of the detection signal, the apparatus is simplified, and, besides, the troubles resulted from the degradation, the error in the light receiving sensor and so forth can be avoided. Furthermore, since the spectral characteristics of the LED are stabilized, the linewidth of the pattern after the developing processing is stabilized regardless of the kind of the resist.

Though the illuminance Id in the dummy light emission and the illuminance Iw in the standby time period are set based on the aforementioned expressions (1) to (3) in the above-described exemplary embodiment, values on the left-hand side and the right-hand side may not be equal (=) but may be approximately equal (≈) as long as substantially same effects are achieved.

Desirably, the time length Td of the dummy light emission is larger than the time length Ts of the exposure. It is because, if the time length Td is smaller than the time length Ts (Td<Ts), there exists the illuminance Is which does not satisfy the expression (3) when the exposure illuminance Is is varied between the maximum value of the illuminance (maximum value of the light emission amount) by the LED light source group 200 and zero. However, in general, it is difficult to use the exposure illuminance Is at the maximum value or thereabout or zero or thereabout. Accordingly, a margin in setting the standby illuminance Iw and the illuminance Id in the dummy light emission can be increased by setting the time length Td of the dummy light emission to be larger than the time length Ts of the exposure.

Further, the present disclosure aims at uniforming, between the cycles, the average light emission amount of the LED light source group 200 in the period ranging from the time point when the wafer W is carried into the housing 10 to the time point when the next wafer W is carried therein. Accordingly, the time of the dummy light emission may be set to come after the exposure as well as before the exposure as stated above.

Figure 6:
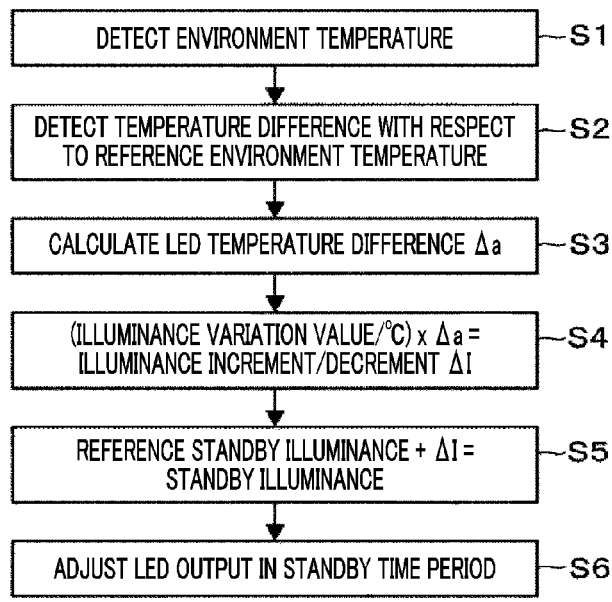
FIG. 6 is a flowchart illustrating a part of another example operation of the substrate processing apparatus according to the exemplary embodiment.

In the above-described exemplary embodiment, the illuminance in the standby time period may be adjusted depending on a temperature of an environment where the substrate processing apparatus is placed. A specific example of this method will be explained. To measure the environment temperature, a temperature detection unit is provided at or near an outer surface of the housing 10 or within the housing 10 where there exists no influence from the irradiation of the LED light source group 200. For example, a temperature detection value from the temperature detection unit is inputted to the controller 3 whenever the wafer W after being exposed is taken out of the housing 10. Referring to FIG. 6, the input of the temperature detection value corresponds to a process S1.

Meanwhile, a reference temperature of the environment temperature is set, and a temperature difference between the temperature detection value and the reference temperature (reference environment temperature) is calculated (process S2), and a LED temperature difference Δa is calculated based on this temperature difference (process S3). The reference environment temperature is an average temperature of the environment temperature when the LED 21 is turned off in a certain time period, for example. Here, the LED temperature difference Δa refers to a temperature difference between a temperature of the LED 21 when the environment temperature is the reference temperature for each illuminance and a temperature of the LED 21 at the environment temperature.

An illuminance increment/decrement ΔId is calculated by adding the LED temperature difference Δa to an illuminance variation value per unit temperature difference of the LED, which is previously calculated (process S4), and an illuminance in the standby time period is calculated by adding the illuminance increment/decrement ΔId to a reference standby illuminance (process S5).

The reference standby illuminance refers to the illuminance Iw calculated from the aforementioned expression (2). If the illuminance (Iw+ΔI) in the standby time period is obtained, the controller 3 outputs, to the circuit control unit 25, a signal according to the duty ratio of the transistor of the driving circuit 27 corresponding to that illuminance in the standby time period, so that the output of the LED light source group 200 (LEDs 21) in the standby time period is adjusted.

As stated above, by adjusting the output of the LED light source group 200 in the standby time period in consideration of the environment temperature, the average light emission amount in the single cycle and the average light emission amount in the standby time period can be made to be coincident with higher accuracy, so that more stabilized exposure can be expected.

A method of considering the environment temperature is particularly advantageous in a case that, for example, a heating module configured to heat the substrate by using a heat source, for example, a heat plate is disposed in the vicinity of the substrate processing apparatus, for example. In such a case, it is desirable to place the temperature detection unit at or near the outer surface of the housing 10 facing the heat source.

Although the method described in FIG. 6 is a method in which the processings are performed through software by the controller 3, the processings may be performed through hardware by using an operation circuit.

The present disclosure is not limited to the apparatus configured to perform the exposure upon the wafer W but may be applicable to an apparatus configured to change a molecular structure in a coating film by irradiating light from an LED to a coating film which is formed on a substrate by coating a chemical liquid thereon. Further, the present disclosure may also be applied to, for example, an apparatus configured to adjust an overdriving amount of a probe needle by imaging a needle mark of the probe needle by irradiating light from the LED thereto and analyzing the imaging result by a computer in an apparatus configured to test electrical characteristics by bringing the probe needle into an electrode pad of an IC chip formed on a wafer. That is, the present disclosure can be applied to various kinds of apparatuses configured to irradiate light to the substrate to perform the processing on the substrate.

EXAMPLES

Comparative Example

By using the substrate processing apparatus according to the above-described exemplary embodiment, a series of operations including carrying 200 sheets of wafers for evaluation into the housing 100, performing the exposure processing on the wafers and carrying the exposed wafers out of the housing 100 are performed while setting the illuminance on the wafers to be 50. If these series of operations are referred to as a pre-processing for the 200 sheets of wafers, the same series of operations (post-processing) are performed on the 200 sheets of wafers after the pre-processing while setting the illuminance on the wafers to be 127.

The same tests including the pre-processing and the post-processing are performed by setting the illuminance in the pre-processing to be 127 and 255, respectively. Here, the figures 50, 127 and 255 are values when the illuminance at the maximum output of the LED light source group 200 is set to be 255. That is, these values may be regarded as the digital values of the control signals capable of obtaining the maximum output.

The dummy light emission time period as stated in the above exemplary embodiment is not provided in both the pre-processing and the post-processing. That is, the pre-processing and the post-processing are performed in the conventional way.

Experimental Example

The same test as in the comparative example is performed except that dummy light emission is performed by providing the dummy light emission time period and setting the illuminance in the standby time period in the post-processing as in the above-described exemplary embodiment.

Figure 7:
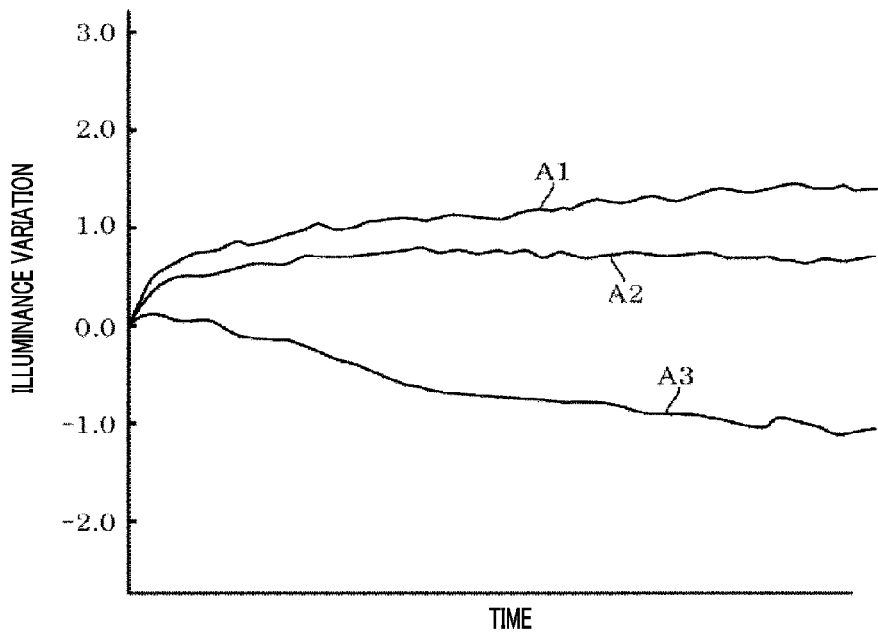
FIG. 7 is a graph showing a result of a temperature transition of the LED in a comparative example.

A result of measuring the LED temperature in the processing on the 200 sheets of wafers as the post-processing is provided in FIG. 7. In FIG. 7, A1, A2 and A3 correspond to the cases where the illuminance in the pre-processing is 50, 127 and 255, respectively. In the comparative example, it is found out that the LED temperature varies while the post-processing is being performed.

Figure 8:
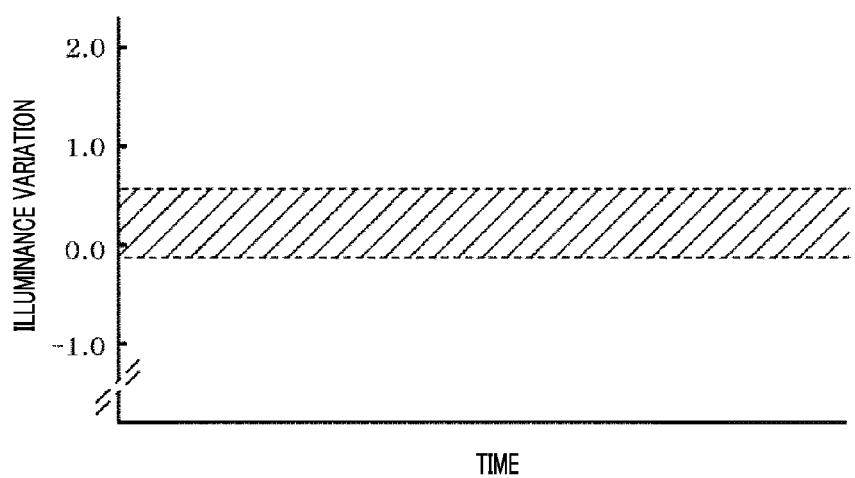
FIG. 8 is a graph showing a result of a temperature transition of the LED in the exemplary embodiment.

Further, the LED temperature is measured in the experimental example as well, and the measurement result is provided in FIG. 8. In this experimental example, the LED temperature in the post-processing falls within a dashed region, which implies that the LED temperature can be stabilized according to the present disclosure, as stated above.

From the foregoing, it will be appreciated that various embodiments of the present disclosure have been described herein for purposes of illustration, and that various modifications may be made without departing from the scope and spirit of the present disclosure. Accordingly, the various embodiments disclosed herein are not intended to be limiting. The scope of the inventive concept is defined by the following claims and their equivalents rather than by the detailed description of the exemplary embodiments. It shall be understood that all modifications and embodiments conceived from the meaning and scope of the claims and their equivalents are included in the scope of the inventive concept.

We claim:

1. A substrate processing apparatus configured to irradiate, to perform a processing on a substrate, light to the substrate in a single cycle ranging from a time point when the substrate is carried into a housing from an outside to a time point when the substrate is ready to be carried out to the outside or to a time point when the substrate is carried out to the outside, the substrate processing apparatus comprising:
   a placing unit configured to place the substrate thereon and provided within the housing;
   a light source unit configured to irradiate the light to the substrate placed on the placing unit, an emission state of the light source unit being varied depending on a temperature thereof; and
   a control unit configured to control the light source unit,
   wherein, when a preset time length of the single cycle is referred to as a cycle time and a time period during which the light is irradiated to the substrate to perform the processing on the substrate is referred to as a processing time period, the control unit is further configured to control the light source unit to perform dummy light emission in a time period other than the processing time period within the single cycle and adjust an illuminance of an irradiation region in the dummy light emission based on an illuminance of the irradiation region in the processing time period such that an average illuminance of the irradiation region within the single cycle is maintained constant between different substrates that are processed by the substrate processing apparatus.

2. The substrate processing apparatus of claim 1,
wherein, when a time period before a next substrate is carried into the housing and a next single cycle is begun and after the single cycle is completed is referred to as a standby time period, an illuminance of the irradiation region in the standby time period is previously set, and
the illuminance of the irradiation region in the dummy light emission is adjusted such that the average illuminance of the irradiation region within the single cycle and an average illuminance of the irradiation region in the standby time period are equal to each other.

3. The substrate processing apparatus of claim 2,
wherein the control unit has a function of obtaining the illuminance of the irradiation region in the dummy light emission based on the illuminance of the irradiation region in the standby time period, the cycle time, a time length of the processing time period, the illuminance of the irradiation region in the processing time period and a time length during which the dummy light emission is performed.

4. The substrate processing apparatus of claim 2,
wherein the illuminance of the irradiation region in the standby time period, a time length of the processing time period and a time length during which the dummy light emission is performed are preset values, and
the control unit is configured to obtain the illuminance of the irradiation region in the dummy light emission based on the preset values and the illuminance of the irradiation region in the processing time period, which is a variable.

5. The substrate processing apparatus of claim 4,
wherein the control unit is configured to determine the illuminance of the irradiation region in the dummy light emission according to a following expression (3):

$$Id = (Tp/Td) \cdot Iw - (Ts/Td) \cdot Is \qquad (3),$$

here, Id denotes the illuminance of the irradiation region in the dummy light emission; Tp, a time length of the single cycle; Td, the time length during which the dummy light emission is performed; Iw, the average illuminance in the standby time period; Ts, the time length of the processing time period; and Is, the illuminance of the irradiation region in the processing time period.

6. The substrate processing apparatus of claim 2,
wherein the illuminance of the irradiation region in the standby time period is adjusted based on a variation of an environment temperature.

7. The substrate processing apparatus of claim 1,
wherein a time length during which the dummy light emission is performed is set to be longer than a time length of the processing time period.

8. The substrate processing apparatus of claim 1,
wherein the dummy light emission is performed by controlling the light source unit to irradiate the light at the adjusted illuminance in a state that the light irradiated by the light source unit does not reach the substrate.

9. The substrate processing apparatus of claim 8,
wherein the state that the light irradiated by the light source unit does not reach the substrate is a state in which the substrate is absent from the irradiation region or a state in which a shutter is provided to block the light between the light source unit and the substrate.

10. A substrate processing method of irradiating, to perform a processing on a substrate, light to the substrate from a light source unit whose emission state is varied depending on a temperature thereof in a single cycle ranging from a time point when the substrate is carried into a housing from an outside to a time point when the substrate is ready to be carried out to the outside or to a time point when the substrate is carried out to the outside, the substrate processing method comprising:

when a preset time length of the single cycle is referred to as a cycle time and a time period during which the light is irradiated to the substrate to perform the processing on the substrate is referred to as a processing time period, controlling the light source unit to perform dummy light emission in a time period other than the processing time period within the single cycle, and adjusting an illuminance of an irradiation region in the dummy light emission based on an illuminance of the irradiation region in the processing time period such that an average illuminance of the irradiation region within the single cycle is maintained constant between substrates.

11. The substrate processing method of claim 10,
wherein, when a time period before a next substrate is carried into the housing and a next single cycle is begun and after the single cycle is completed is referred to as a standby time period, an illuminance of the irradiation region in the standby time period is adjusted based on a variation in an environment temperature.

12. A non-transitory computer-readable recording medium having stored thereon computer-executable instructions that, in response to execution, cause a substrate processing apparatus configured to irradiate, to perform a processing on a substrate, light to the substrate in a single cycle ranging from a time point when the substrate is carried into a housing from an outside to a time point when the substrate is ready to be carried out to the outside or to a time point when the substrate is carried out to the outside to perform a substrate processing method as claimed in claim 10.

13. The substrate processing method of claim 10,
wherein, when a time period before a next substrate is carried into the housing and a next single cycle is begun and after the single cycle is completed is referred to as a standby time period, the illuminance of the irradiation region in the dummy light emission is determined according to a following expression (3):

$$Id=(Tp/Td) \cdot Iw-(Ts/Td) \cdot Is \qquad (3),$$

here, Id denotes the illuminance of the irradiation region in the dummy light emission; Tp, a time length of the single cycle; Td, a time length during which the dummy light emission is performed; Iw, an average illuminance in the standby time period; Ts, a time length of the processing time period; and Is, the illuminance of the irradiation region in the processing time period.

14. A substrate processing apparatus configured to irradiate, to perform a processing on a substrate, light to the substrate in a single cycle ranging from a time point when the substrate is carried into a housing from an outside to a time point when the substrate is ready to be carried out to the outside or to a time point when the substrate is carried out to the outside, the substrate processing apparatus comprising:

a placing unit configured to place the substrate thereon and provided within the housing;

a light source unit configured to irradiate the light to the substrate placed on the placing unit, an emission state of the light source unit being varied depending on a temperature thereof; and a control unit configured to control the light source unit,
wherein the control unit is further configured to control the light source unit to irradiate the light with an illuminance adjusted according to an illuminance of the irradiation region in a processing time period for irradiating the light to the substrate within the single cycle, during a time period during which the substrate is not irradiated with the light within the single cycle, such that an average illuminance of the irradiation region within the single cycle is maintained constant.

* * * * *